US012761688B1

(12) United States Patent
Mohan et al.

(10) Patent No.: US 12,761,688 B1
(45) Date of Patent: Oct. 13, 2026

(54) LOW-LATENCY RETIMER WITH SEAMLESS CLOCK SWITCHOVER

(71) Applicant: Astera Labs, Inc., Santa Clara, CA (US)

(72) Inventors: Jitendra Mohan, Santa Clara, CA (US); Subbarao Arumilli, Cupertino, CA (US); Charan Enugala, Newark, CA (US); Chi Feng, San Jose, CA (US); Ken (Keqin) Han, Fremont, CA (US); Pulkit Khandelwal, Cupertino, CA (US); Vikas Khandelwal, San Jose, CA (US); Casey Morrison, San Jose, CA (US); Enrique Musoll, San Jose, CA (US); Vivek Trivedi, Fremont, CA (US)

(73) Assignee: Astera Labs, Inc., San Jose, CA (US)

( * ) Notice: Subject to any disclaimer, the term of this patent is extended or adjusted under 35 U.S.C. 154(b) by 13 days.

(21) Appl. No.: 19/078,680

(22) Filed: Mar. 13, 2025

Related U.S. Application Data

(63) Continuation of application No. 18/506,387, filed on Nov. 10, 2023, now Pat. No. 12,277,002, which is a continuation of application No. 17/953,458, filed on Sep. 27, 2022, now Pat. No. 11,853,115, which is a continuation of application No. 17/480,051, filed on Sep. 20, 2021, now Pat. No. 11,487,317, which is a continuation of application No. 16/926,614, filed on Jul. 10, 2020, now Pat. No. 11,150,687.

(60) Provisional application No. 62/872,321, filed on Jul. 10, 2019.

(51) Int. Cl.
*G06F 1/12* (2006.01)
*G06F 1/06* (2006.01)
*H03K 5/00* (2006.01)

(52) U.S. Cl.
CPC .................. *G06F 1/12* (2013.01); *G06F 1/06* (2013.01); *H03K 5/00* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 6,265,930 B1 | 7/2001 | Walker et al. | |
| 9,395,745 B2 | 7/2016 | Zhu et al. | |
| 9,571,704 B2 | 2/2017 | Akita et al. | |
| 10,146,722 B1 | 12/2018 | Brown et al. | |
| 12,346,151 B2 * | 7/2025 | Yamane | H04B 1/7087 |
| 2010/0329285 A1 | 12/2010 | Stanton et al. | |

(Continued)

OTHER PUBLICATIONS

Intel Corporation (Samaan et al.), "High-Speed Serial Bus Repeater Primer—Re-driver and Re-timer Micro-architecture, Properties and Usage," Revision 1.2, Oct. 2015, 72 pages.

(Continued)

*Primary Examiner* — Cassandra F Cox
(74) *Attorney, Agent, or Firm* — Charles Shemwell

(57) ABSTRACT

A low-latency signaling link retimer generates an output signal transmission synchronously with respect to a core clock signal alternately selected from two or more plesiochronous or mesochronous clock sources with switchover between or among the core-clock sources executed without shrinking, extending or otherwise disrupting the edge-to-edge core clock period or clock duty cycle.

20 Claims, 3 Drawing Sheets

(56) References Cited

U.S. PATENT DOCUMENTS

| | | | |
|---|---|---|---|
| 2012/0082463 A1 | 4/2012 | Kasprzyk | |
| 2017/0351640 A1 | 12/2017 | Nilange et al. | |
| 2018/0167061 A1 | 6/2018 | Park et al. | |
| 2019/0258600 A1 | 8/2019 | Das Sharma | |

OTHER PUBLICATIONS

Intel Corporation, "PCI Express (PCIe) 4.0 Retimer Supplemental Features and Standard BGA Footprint, Revision 004," Jun. 2018, 53 pages.

PCI-SIG, "PCI Express Base Specification Revision 5.0 Version 1.0", May 22, 2019, 1299 pages.

* cited by examiner

FIG. 1 Retimer with Seamless Clock Switchover
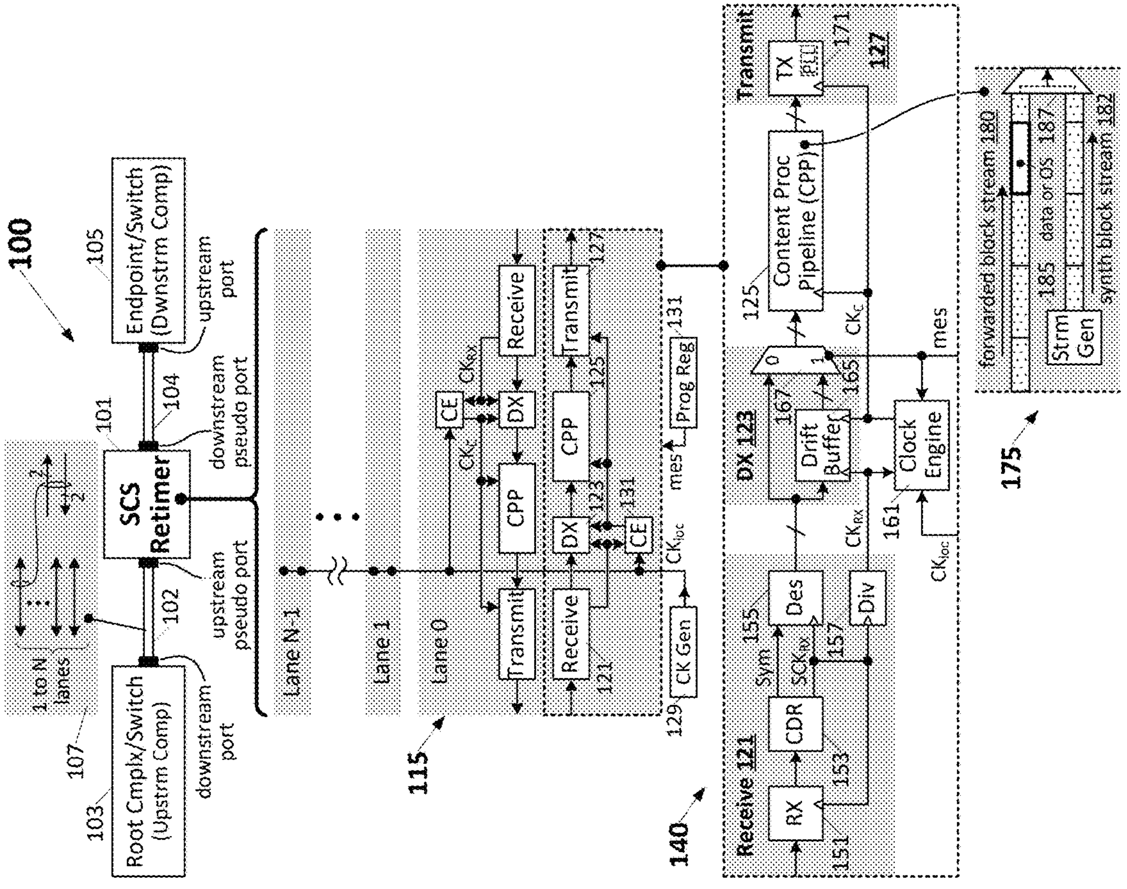
FIG. 2
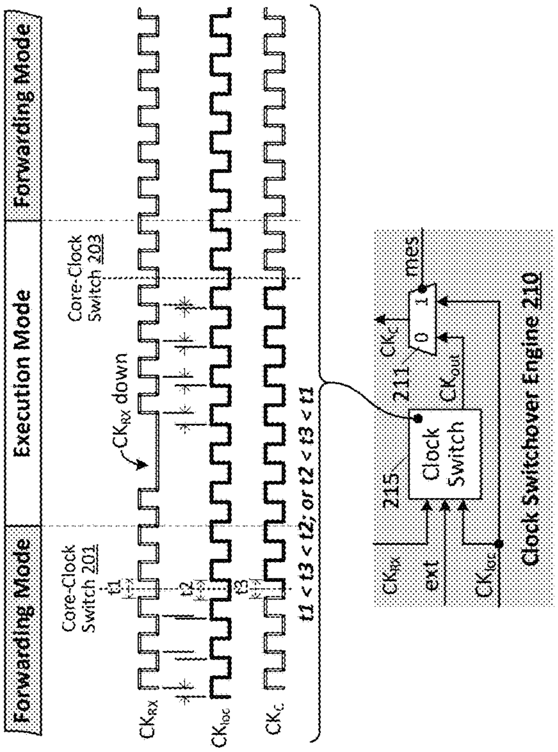
FIG. 3
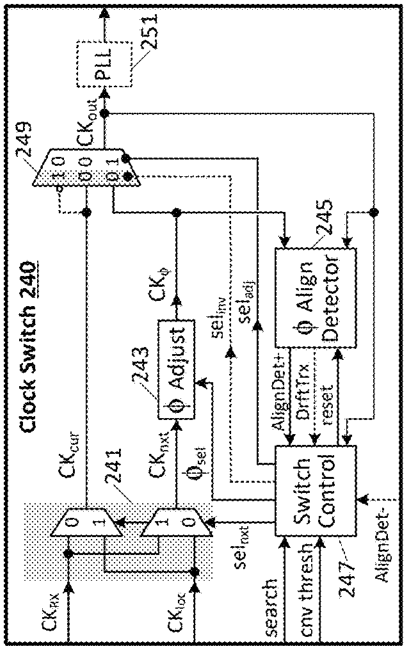

LOW-LATENCY RETIMER WITH SEAMLESS CLOCK SWITCHOVER

CROSS REFERENCE TO RELATED APPLICATIONS

This application is a continuation of U.S. application Ser. No. 18/506,387 filed Nov. 10, 2023 (U.S. Pat. No. 12,277,002), which is a continuation of U.S. application Ser. No. 17/953,458 filed Sep. 27, 2022 (U.S. Pat. No. 11,853,115), which is a continuation of U.S. application Ser. No. 17/480,051 filed Sep. 20, 2021 (U.S. Pat. No. 11,487,317), which is a continuation of U.S. application Ser. No. 16/926,614 filed Jul. 10, 2020 (U.S. Pat. No. 11,150,687), which claims the benefit of U.S. provisional application No. 62/872,321 filed Jul. 10, 2019. Each of the above-identified applications is hereby incorporated by reference.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a synchronous signaling system having a seamless-clock-switchover (SCS) retimer coupled between upstream and downstream components via respective signaling links;

FIG. 2 illustrates a seamless clock-source switchover from a stream-embedded clock to a locally generated clock;

FIG. 3 illustrates an embodiment of a clock switch that may be deployed within the clock engines of FIGS. 1 and 2;

DETAILED DESCRIPTION

Figure 5:
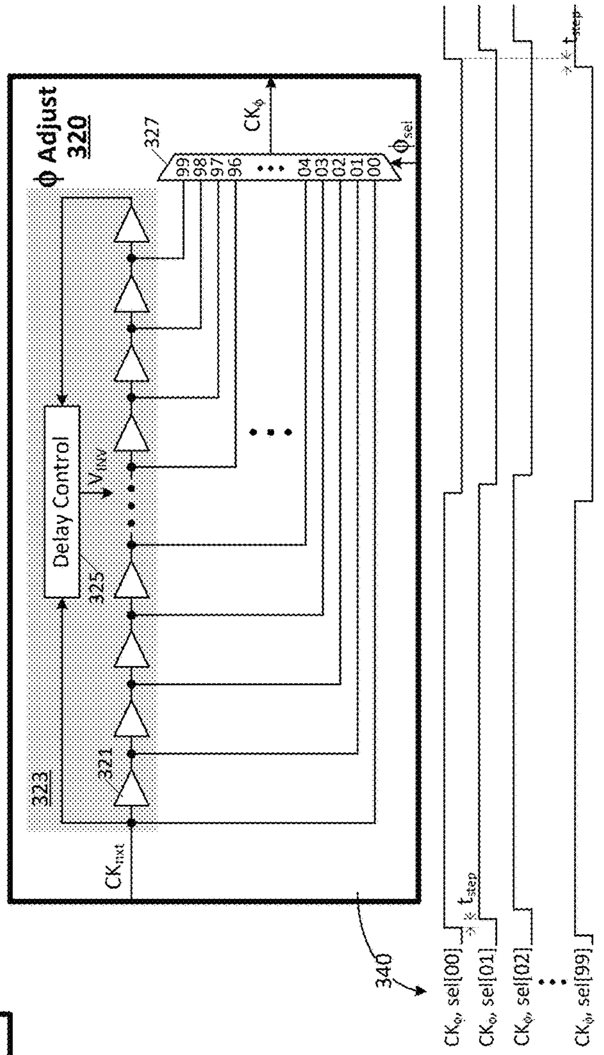
FIG. 5 illustrates an embodiment of a phase adjust circuit that may be deployed within the clock switch of FIG. 3.

In various embodiments herein, content-processing circuitry and transmit circuitry within a low-latency signaling link retimer are timed (clocked) by a core clock signal alternately selected from two or more plesiochronous or mesochronous clock sources with switchover between or among the core-clock sources executed without shrinking, extending or otherwise significantly disrupting the edge-to-edge core clock period or clock duty cycle—referred to herein as seamless clock switchover. In a number of embodiments, one of the two clock sources is a receive clock ($CK_{RX}$) recovered from an inbound symbol stream and subject to occasional drop-out (i.e., when no traffic), while the other is a local clock ($CK_{loc}$) generated by a free-running clock source within or coupled to the retimer. In contrast to conventional retimer architectures in which the receive clock and local clock are dedicated to mission mode data reception and transmission, respectively, low-latency retimer embodiments herein apply the receive clock throughout the mission-mode symbol progression path, from input receiver to output transmitter, thus avoiding the substantial latency penalty otherwise incurred in the domain crossing between the receive and local clock domains. Prior to or as part of retimer transition from mission mode (i.e., "forwarding mode" as the retimer forwards a received symbol stream with or without content modification to a downstream or upstream destination), a clock switchover circuit referred to herein as a clock engine seamlessly switches the core clock source from the receive clock to the local clock at a point of alignment between receive clock and local clock edges such that successive edges within the core clock are contributed by each of the two source clocks and the core clock period through switchover falls non-disruptively/seamlessly between the periods of the two clock sources. In a number of embodiments, the clock engine speeds convergence to the point of receive-clock/local-clock alignment by searching for and identifying a phase-shifted instance of the clock source to be switched to (the "next clock") and switching the core-clock source from the currently selected clock source (the "current clock") to the phase-shifted instance of the next clock. After clock switchover, the phase offset between the phase-shifted instance of the now-current clock and its unshifted source clock (e.g., $CK_{loc}$ or $CK_{RX}$) is incrementally/iteratively reduced to zero to minimize core clock jitter. In yet other embodiments, the local clock is distributed throughout the retimer die at a frequency substantially lower than the symbol stream propagation rate, and clock switchover is executed by generating multiple frequency-divided phases of the receive clock, identifying frequency-divided receive-clock phases that bound (precede and succeed) the local clock phase and executing the clock switchover with respect to the local clock and bounding frequency-divided receive-clock phases.

FIG. 1 illustrates an embodiment of a synchronous signaling system 100 having a seamless-clock-switchover (SCS) retimer 101 coupled between upstream and downstream components 103, 105, via respective signaling links 102 and 104. Retimer 101 extends the viable signaling path length between the upstream and downstream components by applying timing information and digital data recovered from an inbound symbol stream (sourced by either of components 103, 105 and destined for the other) to produce an enhanced-integrity outbound symbol stream (with occasional content modification)—overall, permitting the upstream and downstream components to communicate reliably (e.g., meeting specified bit error rate) over otherwise impracticable distances.

For purposes of example and clarity of explanation, signaling links 102, 104 and driver/receiver ports within retimer 101, upstream component 103, and downstream component 105 (i.e., downstream port of component 103, upstream port of component 105 and upstream/downstream pseudo ports of retimer 101, as shown) are assumed to implement a Peripheral Component Interconnect Express (PCIe) communication specification and thus described in the terminology of that specification. Accordingly, upstream component 103 may be a root complex or switch and the downstream component 105 may be an endpoint or switch, and the signaling link coupled between a given pair of components (i.e., upstream component and retimer or downstream component and retimer) may be implemented by 1 to N lanes (e.g., 1, 2, 4, 8, 12, 16, 32, etc.) with each lane including a dedicated differential signaling pair for each signaling direction—an arrangement generally shown at 107.

Symbols conveyed in respective unit intervals on a given lane (i.e., duration of a valid symbol at a given point on a differential conductor pair) are assumed to be bits so that each unit interval (UI) is a bit time ($t_{bit}$). Further, information is scrambled and (in some cases) precoded prior to transmission (i.e., encoded for spectral diversity and/or other signal integrity purposes) into 130-bit logical blocks that correspond to 128 bits of raw content (i.e., **128*b*/130*b* encoding scheme) and two bits of block encoding. Each logical block ("block" for short) conveys either physical-layer control information—so-called "ordered-set" blocks—or payload information (including control information for higher PCIe protocol layers) in "data" blocks. Unless otherwise stated or clear from context, references herein to data streams (or block streams or bit streams or symbol streams) should be understood to include serial streams of ordered-set blocks ("ordered-sets") and/or data blocks, and references to "data" should likewise be understood to include control information (i.e., contents of ordered-set blocks) and/or payload information. For ease of understanding, link (or interconnect) operation is occasionally described below in the context of a single lane—in all cases the link may include multiple lanes each conveying respective serial block streams. In the high-speed, embedded-clock, scrambled and precoded signaling contemplated herein (e.g., 32 giga-transfers per second (32 GT/s) with, for example, one single-bit symbol transfer per edge of a 16 GHz transmit clock or one two-bit symbol transfer (e.g., 4-PAM) per edge of an 8 GHz transmit clock) each of the system components (101, 103, 105) generally includes receive/transmit equalization circuitry, lane-to-lane skew compensation circuitry, clock/data recovery (CDR) circuitry, clock-domain crossing circuitry, data scrambling and descrambling circuitry and data precoding/decoding circuitry. In all embodiments, these various circuit elements may be supplemented by others and/or omitted (e.g., lane deskew circuitry omitted or disabled in a single-lane signaling system), faster or slower transfer rates may apply, other logical data organization and/or physical signaling line configuration may apply, 4-level pulse amplitude modulation (4-PAM) symbols (two-bits per symbol) or other multiple-bit symbols may be conveyed on each or any lane per UI, and more generally, physical signaling and signaling protocols according to specifications other than PCIe may be implemented. Also, while block precoding is shown and described with respect to the FIG. 1 embodiment and those discussed below, precoding (and corresponding decoding) may be disabled or omitted altogether in all cases. Though a single link retimer is shown between components 103 and 105, one or more additional retimers (and/or re-drivers or other reach-extension devices) may be deployed to further extend the practicable signaling distance between components 103 and 105. In such cases, the component downstream and/or upstream from SCS link retimer 101** may be another link retimer.

Referring to detail view 115 of lane 0 within an N-lane retimer, the symbol-stream forwarding path in each direction includes a receiver 121, domain-cross element 123, content processing pipeline 125 and transmitter 127, all of which operate synchronously with respect to one of two clock signals-a receive clock recovered from (and used to sample) the inbound symbol stream or a local clock generated by a retimer-resident clock generator 129 (which may itself receive a reference clock from an off-die or on-die oscillator). More specifically, a clock engine 131 receives both the local clock and receive clock signals and, based on retimer state and programmed information indicative of local clock/receive clock timing relationship (i.e., mesochronous signal, "mes," from programmable register 131), alternately selects either the receive clock ($CK_{RX}$) or the local clock ($CK_{loc}$) to clock circuitry within the core symbol propagation path from the point of domain-crossing unload forward (i.e., unloading a drift buffer within domain-crossing element 123, clocking content processing pipeline 125 and clocking transmitter 127) and thus constitute a core clock signal, $CK_C$.

Continuing with FIG. 1 and referring to the detail view 140 of the downstream symbol forwarding path of lane 0, receiver 121 includes a synchronous signal receiver/sampler 151, clock-data-recovery circuit (CDR) 153, deserializer 155 and clock divider 157. In one embodiment, symbols (assumed to be bits for simplicity) arrive and are sampled within signal receiver 151 at 32 GT/s (32 giga-transfers per second) in response to rising and falling edges of a 16 GHz serial receive clock ($SCK_{RX}$) embedded in the symbol stream (and extracted along with data samples via CDR 153). Deserializer 155 deserializes the 32 GT/s symbol stream ("Sym") in response to edges of the serial receive clock to produce a 1 GHz stream of 32-bit symbols (or 64-bit symbols in the case of PAM-4 symbol reception within receiver/sampler 151) that are accompanied by a frequency-divided 1 GHz receive clock, $CK_{RX}$ (i.e., frequency divider 157 performs ×16 clock division in the depicted example). The receive clock is supplied to clock switchover engine 161 ("clock engine") and to the load timing input of a drift buffer 165 within domain-cross element 123. The clock engine—which also receives a 1 GHz instance of the locally generated clock, $CK_{loc}$, the configuration signal indicating whether the $CK_{loc}$ and $CK_{RX}$ are mesochronous (e.g., mes=1) or plesiochronous (mes=0), and other retimer mode information discussed below—outputs either the local clock or the receive clock as the core clock $CK_C$ which times all synchronous components beyond domain-cross element 123, including any necessary domain-cross circuit unloading (e.g., unloading symbols loaded into drift buffer 165 in response to $CK_{RX}$), content processing pipeline 125 and a signal transmitter 171 within transmitter block 127. Though not specifically shown, signal transmitter 171 includes serializing circuitry to reverse the symbol-parallelizing operation of deserializer 155 and a clock multiplying circuit (e.g., multiplying phase-locked-loop, PLL) to multiply the core clock frequency (e.g., from 1 GHz to a 16 GHz) as necessary to serialize and transmit symbols at the link symbol rate.

Referring to detail view 175, SCS retimer 101 generally operates in one of two modes: forwarding mode in which a received symbol stream (or block stream) is forwarded/re-transmitted (and hence referred to as a forwarded stream 180) via transmitter 171 after occasional content inspection/modification within content processing pipeline 125; and an execution mode in which the retimer outputs a self-generated or synthesized symbol stream/block stream 182 instead of the received stream. In the embodiment shown, content processing pipeline includes circuitry 185 to generate the synthesized stream and switching circuitry (shown conceptually at 187) to select between the forwarded and synthesized streams/paths according to retimer mode-operations carried out in response to timing edges supplied by the core clock signal. As the inbound symbol flow occasionally ceases during execution mode (a "link down" event that constitutes at least one motivator for transition to execution mode), the receive clock recovered from the inbound symbol stream also goes down (i.e., ceases to toggle or "flat lines"). In view of this occasional clock loss, conventional retimers apply the local clock exclusively to clock retimer core circuitry and output transmitter, generally employing a relatively deep (and therefore high latency) first-in-first-out (FIFO) buffer to ensure viable clock domain crossing across all permissible clocking conditions. In SCS retimer 101, by contrast, domain-cross buffering is obviated entirely in the case of plesiochronous receive and local clock instances (i.e., clocks having a frequency delta up to a tolerable maximum), with the receive clock, $CK_{RX}$, being applied as the forwarding-mode core clock and thus as the sole synchronous timing reference from receiver to transmitter. That is, there is no forwarding-mode clock domain crossing so that the symbol stream is output from deserializer 155 (where it has been parallelized within the receive clock domain) directly to the content processing pipeline 125 (via multiplexer 167 as the mesochronous configuration signal will be deasserted in the case of plesiochronous receive/local clocks), dramatically reducing input-to-output latency within retimer 101 relative to conventional "elastic FIFO domain-cross" architectures. When transition from forwarding mode to execution mode is imminent (and after which $CK_{RX}$ may flat line at any time), clock engine 161 searches for and detects an alignment between respective edges of $CK_{RX}$ and $CK_{loc}$, switching the core-clock source from $CK_{RX}$ to $CK_{loc}$ prior to the subsequent edges in either of those clocks so that the core clock exhibits no disruption—i.e., no extended or shortened low or high pulse, and such that the time between the final edge in the former clock source and the initial edge in the newly selected clock source is a blend of (and falls between) the time between any two edges within either clock source. FIG. 2 illustrates this seamless switchover technique graphically showing switchover of the core clock source from $CK_{RX}$ to $CK_{loc}$ at 201, just prior to retimer transition from forwarding mode to execution mode, and then another core-clock switch (from $CK_{loc}$ to $CK_{RX}$) at 203, just prior to the reverse transition from execution mode to forwarding mode. Referring to edge-to-edge time periods t1, t2 and t3 as depicted in FIG. 2, t3 will fall between t1 and t2 with either (i) t1<t3<t2 or (ii) t2<t3<t1 being true depending on which of $CK_{RX}$ and $CK_{loc}$ is the higher frequency clock.

As can be understood from the FIG. 2 clock switchover example, the slower the beat frequency between the $CK_{RX}$ and $CK_{loc}$ (i.e., the smaller the difference in their frequencies), the longer it will take for the clocks to drift into alignment, and, in the infinite-limit same-frequency/different-phase case (i.e., mesochronous clocks), the clocks will never align. In one embodiment, an architecturally-dictated mesochronous relationship between the receive clock and local clock is communicated to the host retimer by another system component—for example, in the form of an instruction to program the mesochronous field within register 131 of FIG. 1 with a value indicating the mesochronous relationship. In that case, clock switchover engine may operate in a static mode, selecting the local clock exclusively as the core clock (e.g., via multiplexer 211 as shown within clock switchover engine 210 of FIG. 2) regardless of retimer mode. As the clock phase difference between mesochronous clocks can generally be crossed with a shallow "drift-buffer" as shown at 167 of FIG. 1 (e.g., a few register stages), the retimer effectively operates in a single clock domain with phase offset between receiver and downstream circuitry bridged by the drift buffer.

When configured for plesiochronous rather than mesochronous clocking (i.e., mes=0), clock switch 215 within the FIG. 2 clock engine embodiment detects the alignment condition shown at 201 and 203 and responsively executes the switchover. As discussed in further detail below, where the beat frequency between the two source clocks ($CK_{RX}$, $CK_{loc}$) is so low as to yield an unsuitably long alignment delay—that is, the time required for the two clocks to drift into alignment exceeds a predetermined convergence interval (as measured, for example, in counted core clock cycles), clock switch 215 performs an active search for a phase alignment by iteratively adjusting the phase of one source clock relative to the other until an edge crossing is detected and then executing the switchover with respect to the phase-adjusted clock.

FIG. 3 illustrates an embodiment of a clock switch 240 that may be deployed within the clock engines of FIGS. 1 and 2. As shown, clock switch 240 includes a next-clock/current-clock multiplexer 241 ("input multiplexer"), a phase-adjuster 243, alignment detector 245, switch controller 247, output multiplexer 249 and optional phase-locked loop 251. Input multiplexer 241 responds to a select-next signal ($sel_{nxt}$) from switch controller 247 by selecting one of the two source clocks—$CK_{RX}$ and $CK_{loc}$—to be the "current clock," $CK_{cur}$, and the other to be the "next clock," $CK_{nxt}$. Except during a "back-out" operation discussed below, switch controller 247 lowers $sel_{adj}$ so that the current clock is output, via output multiplexer 249 and optional PLL 251, as $CK_{out}$; the output clock that, during non-mesochronous clocking configuration (mes=0), is output from the host clock engine (e.g., via multiplexer 211 of FIG. 2) as the retimer core clock. As shown, $CK_{nxt}$ is supplied to phase adjuster 243 which, in turn, outputs a search clock, $CK_{\phi}$, having a phase offset relative to $CK_{nxt}$ according to a phase-select value, $\phi_{sel}$.

When a search signal ("search") is asserted (i.e., one of the external "ext" signals shown within clock engine 210 of FIG. 2), switch controller 247 issues a reset signal to alignment detector 245 to trigger a search for edge alignment (or edge convergence) between the next clock and the current clock. In one embodiment, switch controller also resets $\phi_{sel}$ to clear any phase-offset within the phase-adjuster 243 so that the search clock (CK) and next clock have the same phase (and may be the same clock, electrically speaking). In a "drift-convergence" scenario where the current and next clocks drift into alignment within a time interval shorter than a programmed or hard-wired convergence threshold (which, in the case of programming, may be established by training), alignment detector 245 will assert an align-detect signal (AlignDet) to signal the alignment and switch controller will responsively toggle $sel_{nxt}$ (e.g., a quarter clock cycle after the alignment event and thus approximately midway between two clock edges in either source clock) to reverse the roles of the two source clocks, making the former "next clock" the current clock and thus the source of the retimer core clock, and making the former "current clock" the next clock in a later-executed clock-switchover.

Upon transition between the two plesiochronous source clocks a slight, but abrupt change in output clock period (clock frequency) will occur. In one embodiment, PLL 251 may be a unity-multiply component (same input and output clock frequency) provided for purposes of smoothing the frequency change in the output clock. That is, the PLL bandwidth may be set low enough that the PLL loop filter effectively spreads the frequency change over several (or numerous) output clock cycles as the loop filter charges or discharges in accordance with the source-clock frequency difference. In other embodiments, particularly where downstream multiplying PLLs are present for other purposes (and similarly have bandwidths that provide sufficient filtering) or where retimer circuitry clocked by the core clock is impervious to minor abrupt frequency changes, PLL 251 may be omitted.

Still referring to FIG. 3, when the current and next clocks do not drift into alignment within the interval specified by the convergence threshold (i.e., align-detect signal not asserted within the convergence interval), switch controller 247 commences an assisted convergence search by iteratively adjusting the phase-select value, $\phi_{sel}$—for example, incrementally advancing $\phi_{sel}$ until alignment detector signals a phase alignment between the search clock ($CK_{\Phi}$) and output clock. At that point, switch controller asserts $sel_{adj}$ to select the $CK_{\Phi}$ (i.e., phase offset version of $CK_{nxt}$) to source the output clock (and thus the core clock).

Figure 4:
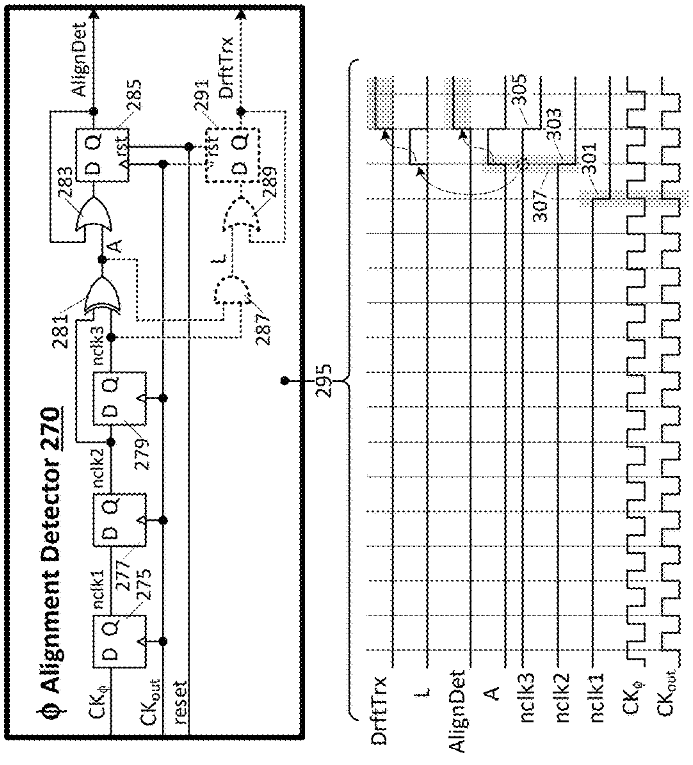
FIG. 4 illustrates an embodiment of a phase-alignment detector that may be deployed within the clock switch of FIG. 3.

FIG. 4 illustrates an embodiment of a phase-alignment detector 270 that may be used to implement alignment detector 245 of FIG. 3. In the embodiment shown, the search clock ($CK_{\Phi}$) is supplied to the data input of a first flop stage 275 in a daisy-chained set of flop stages (i.e., output of flop stage 275 coupled to input of flop stage 277; output of flop stage 277 coupled to input of flop stage 279), with all stages in the chain edge-triggered by the output clock ($CK_{out}$). By this arrangement, the search clock state is sampled by the output clock (i.e., high/low level of search clock captured within flop stage 275 in response to transition of output clock) and ripples through the sequence of flop stages 277, 279 in successive output clock cycles. Accordingly, any change in search clock state from one sampling edge of output clock to the next—for example as shown in timing diagram 295—will ripple through the flop stages (i.e., falling edges 301, 303, 305) and produce, by virtue of the one cycle delay between the outputs of flop stages 277 and 279, a single-clock-cycle "alignment" pulse ("A") at the output of XOR gate 281. At the next sampling edge of the output clock (rising edge in this example), the asserted alignment pulse will be clocked into flop stage 285 (i.e., passing through OR gate 283) to produce an align-detect signal assertion, latching that signal assertion (by virtue of feedback via OR gate 283) until the switch controller issues a reset signal (e.g., to commence a new search).

In one embodiment, the FIG. 4 phase alignment detector 270 includes circuitry to determine whether the sample-to-sample state change that yielded the alignment detection is a drift-induced transition from low to high (sampling low on one $CK_{out}$ edge and then sampling high on the next) or from high to low—"drift transition" information that, when combined with the drift direction indicates whether the detected clock alignment is between rising edges of $CK_{out}$ and CK or between rising and falling edges of $CK_{out}$ and CK, respectively. In the depicted example, AND gate 287 produces a logic high or low output pre-transition sample-level signal (L) according to the state of nclk3 when the output of XOR gate 281 goes high. The pre-transition sample-level signal passes through OR gate 289 (i.e., OR gate outputs high or low according to whether L is high or low, respectively) to be captured within flop stage 291 concurrently with assertion of the alignment detection signal (output of flop 285), latching a logic '1' drift-transition output (DrftTrx=1, meaning a high state of $CK_{\Phi}$ was sampled followed by a low state of $CK_{\Phi}$) via OR gate 289, and latching a logic '0' drift-transition (DrftTrx=0, meaning a low-state of CK was sampled followed by a high state) output by virtue of the deassertion of signal A at least over an interval of interest.

Referring to FIGS. 3 and 4, in one embodiment, alignment detector 245 (or 270) outputs the drift-transition signal to the switch controller which also receives information (e.g., AlignDet−) that enables determination of the drift direction and thus whether the detected clock alignment is in-phase (rising-edges of $CK_{nxt}$ and $CK_{out}$ aligned), or complementary (rising edge of $CK_{out}$ aligned with falling-edge of $CK_{nxt}$). In the case of in-phase alignment detected in a drift-convergence search, switch controller 247 operates as discussed above, transitioning $sel_{nxt}$ to swap the roles of the current and next clocks. In the case of a complementary alignment detected in a drift-convergence search, switch controller 247 may take several alternative actions (which may be programmably specified and/or hard-wire designed) including, for example and without limitation: (i) issue a reset to the phase alignment detector to trigger a new drift-convergence search which should, absent error, yield an in-phase alignment at the next align-detect signal assertion, (ii) concurrently assert the $sel_{nxt}$ signal and a $sel_{inv}$ signal to select a complementary version of $CK_{cur}$ (i.e., inverted version of the former $CK_{nxt}$ that yielded the complementary phase alignment) via multiplexer 249, (iii) revise the phase-select value $\phi_{sel}$ to institute a 180° phase delay through phase adjust circuit 243 (and thus advance $CK_{\Phi}$ by 180 degrees) and concurrently with that phase-shift or shortly thereafter assert $sel_{adj}$ to select the now in-phase aligned instance of $CK_{\Phi}$ as $CK_{out}$ (followed by back-out operation as discussed below); (iv) revise the phase-select value to institute a $CK_{\Phi}$ phase shift somewhat short of 180 degrees, followed by assisted-convergence search and ensuing switchover/back-out operations as discussed below.

Continuing with FIGS. 3 and 4, switch controller 247 may obtain drift direction information (i.e., which of clocks $CK_{nxt}$ and $CK_{cur}$ is oscillating at higher frequency and thus the direction of edge-drift in one of those clocks relative to the other) from assertion of an alignment detection signal from another clock switch seeking alignment between $CK_{out}$ and a phase-offset version of $CK_{nxt}$ or between $CK_{nxt}$ and a phase-offset version of $CK_{out}$ (as discussed below), from a quadrature sampler (e.g., sampling $CK_{nxt}$ with four 90°-shifted versions of $CK_{out}$ to enable a determination of drift direction by detecting instances of more than two '1' or more than two '0' samples), from an initialization-time determination of relative clock frequencies (which may be occasionally re-ascertained during system run-time) and recordation of corresponding drift information for use by switch controller 247, and so forth.

FIG. 5 illustrates an embodiment of a phase adjust circuit 321 that may be deployed as phase adjust circuit 243 of FIG. 3. As shown, a set of N standard-cell buffers (e.g., each implemented by a series-coupled pair of inverters with the output of leading inverter coupled to input of trailing inverter) are coupled in series (daisy-chained) to produce, at the output of each buffer, a respective search clock that is phase-staggered relative to the clock phase at the input of the buffer by the buffer propagation delay. In the depicted embodiment, buffer chain is coupled in a delay locked loop 323 having a delay controller 325 that adjusts the supply voltages (VINV) to buffers 321 (i.e., thus adjusting the output slew rates/propagation delay of constituent inverters in a current-starved configuration) as necessary to produce alignment between the buffer chain input ($CK_{nxt}$) and the output of the final buffer and thus establishing the propagation delay through each buffer at $TCK_{nxt}/N$ (where $TCK_{nxt}$ is the period or cycle time of $CK_{nxt}$). Assuming a nominal $CK_{nxt}$ frequency of 1 GHz and a 100-buffer chain (i.e., N=100), then the search clock phase at each buffer output is phase staggered by 10 picoseconds (ps) relative to the prior search clock phase (i.e., $t_{step}$ as shown in waveform diagram 340 is 10 ps).

Still referring to FIG. 5, the N search clock phases (including $CK_{nxt}$ itself as the $0^{th}$ phase) are supplied to a multiplexing structure 327 that selects any one of the search clock phases according to the phase-select signal ($\phi_{sel}$) from the FIG. 3 switch controller 247. In alternative embodiments, the conceptual single-stage 100-input multiplexer may be implemented by hierarchically coupled multiplexer stages and N may be any practicable value. Also, delay control circuit 325 (i.e., generating current-starved inverter control voltage, VINV) may be omitted in alternative embodiments so that the buffer chain implements an open loop delay line that produces a sufficient number of search clock phases to span the search interval of interest (e.g., spanning period of $CK_{loc}$ and/or $CK_{RX}$).

Referring to both FIGS. 3 and 5, after completing an assisted-convergence search (i.e., alignment detector 245 signals a phase alignment between a given search clock phase and output clock) and asserting $sel_{adj}$ to select the $\phi_{sel}$-selected search clock phase to source the output clock ($CK_{out}$), the output clock will propagate through some number (M) of buffers 321 within the delay line (i.e., FIG. 5 buffer chain) and thus suffer cumulative jitter from each of those M buffers. In one embodiment, this jitter is eliminated by the aforementioned back-out operation. More specifically, after switching the output clock source over to the search clock (i.e., asserting $sel_{adj}$ as discussed above), switch controller 247 iteratively lowers the phase-select value, delaying for a settling time after each phase step, until the unadjusted next clock is reached (i.e., $\phi_{sel}$=0 in the FIG. 5 phase adjuster implementation). The mux controls are generated in such a way as to not introduce a glitch at the mux output. At that point ($\phi_{sel}$=0), next clock is sourcing the output clock so that the $sel_{adj}$ and $sel_{nxt}$ signals may be simultaneously toggled (e.g., at a midpoint between $CK_{nxt}$ edges and thus in response to a quadrature instance (90-degree phase-shifted instance) of next clock which may be obtained, for example, from the FIG. 5 buffer chain) to reverse the next clock and current clock selections within input multiplexer 241 and route the current clock through output multiplexer 249 to source $CK_{OUT}$. In one embodiment, the phase step in each back-out iteration may be programmatically specified (e.g., 1 buffer per step, 2 buffers, 4 buffers, or any practicable number) in accordance with system configuration or run-time determined phase-step tolerance. Additionally (or alternatively), the settling time between each backout iteration ($t_{settle}$) may be programmatically established or run-time trained (e.g., resolving to step size determined not to destabilize or intolerably perturb downstream circuitry).

Figure 6:
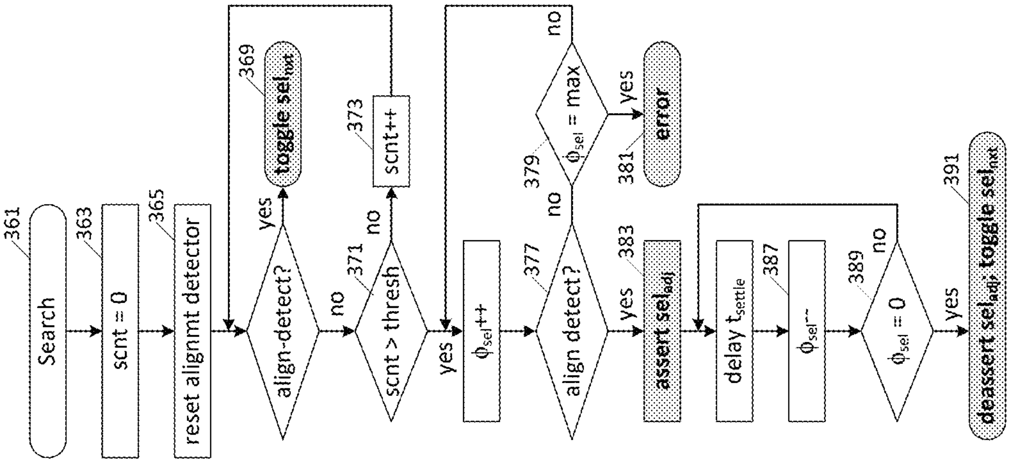
FIG. 6 illustrates an exemplary clock switchover operation implemented by the switch controller of FIG. 3.

FIG. 6 illustrates an exemplary clock switchover operation implemented by the switch controller of FIG. 3 (e.g., within a finite state machine, processor or other clocked control circuitry) in response to assertion of the search signal (i.e., instruction to commence a clock switchover as shown at 361). Starting at 363, a search count value ("scnt") is cleared in preparation for alignment/convergence search and then a reset is issued to the alignment detector at 365 to commence a drift-convergence alignment search. The align-detect signal is evaluated (367) in successive cycles of the output clock, triggering clock switchover and search termination (toggling $sel_{nxt}$ at 369, and optionally selecting a complement version of $CK_{cur}$ as discussed above) if alignment is detected. If align-detect remains deasserted after a given output clock cycle (i.e., negative determination at 367), the search count is compared with a threshold at 371 (e.g., convergence threshold supplied to the switch controller as shown in FIG. 3) to determine whether the drift-convergence interval has elapsed. If not (i.e., search count less than threshold yielding negative determination at 371), the search count is incremented at 373 and the drift-convergence search iterates for another output clock cycle.

Still referring to FIG. 6, if the drift-convergence interval transpires without alignment detection (affirmative determination at 371), the switch controller commences an assisted-convergence search by incrementing the phase-select value at 375 and then checking for align-detect signal assertion at 377, iteratively performing the phase select increment until either (i) the alignment detector asserts the align-detect signal (affirmative determination at 377) or the phase-select value increments through the entire range without alignment detection. In the latter case (affirmative determination at 379), an error is signaled (381) to host control circuitry within the retimer to enable remedial action and/or error-reporting to upstream and/or downstream link components. If the alignment is detected at 377, the switch controller asserts $sel_{adj}$ at 383 to effect clock source switchover from the current clock to the search clock (i.e., switching to phase-offset instance of $CK_{nxt}$) and then commences the jitter-mitigating back-off operation discussed above. That is, the switch controller iteratively delays for a programmed or otherwise predetermined settling interval ($t_{settle}$ as shown at 385) and then decrements the phase-select value (387), continuing the back-off loop until the phase-select value has been decremented to zero. At this point (affirmative determination at 389), the switch controller deasserts $sel_{adj}$ and toggles $sel_{nxt}$—an operation that maintains the same output clock source, but through reversal of the next-clock/current-clock paths, thus making ready for a subsequent alignment search.

Still referring to FIG. 6, in a number of embodiments, phase offsets identified during assisted convergence search are recorded in a register for reapplication (e.g., as a search starting point) in subsequent clock switchover operations. Similarly, drift-direction information, clock inversion information (i.e., where inverted version of $CK_{nxt}$ is selected to drive $CK_{out}$ and thus $CK_C$) or any other information obtained in an assisted-convergence and/or drift-convergence search may be recorded and reapplied. In yet other embodiments, particularly where drift-direction information is known a priori (e.g., and recorded within the retimer), binary searching or other accelerated searching sequences (i.e., accelerated relative to the linear phase-alignment search discussed above) may be applied to reduce clock switchover time.

Figure 7:
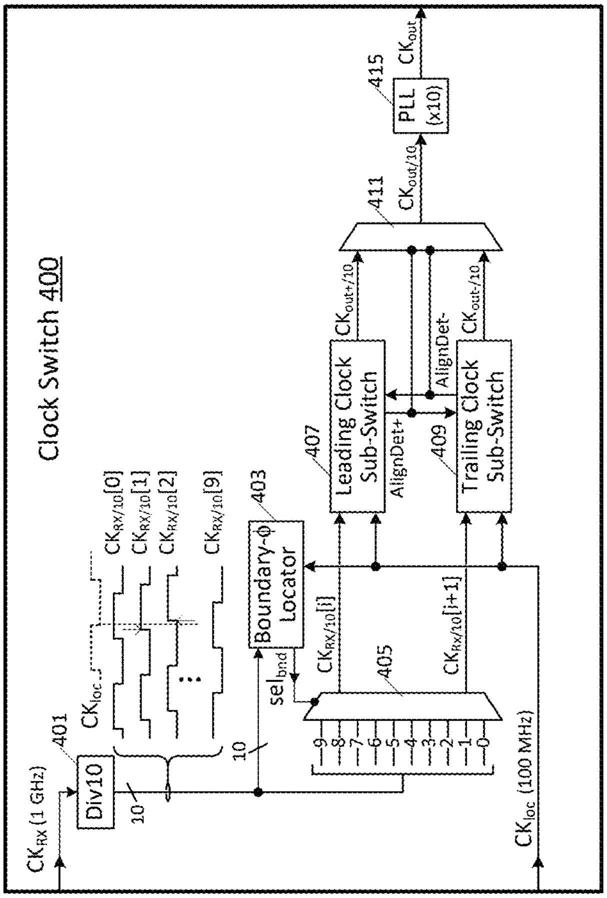
FIG. 7 illustrates an alternative embodiment of a clock switch for application in a retimer in which a relatively low frequency local clock is distributed throughout the retimer architecture and multiplied to internal symbol-rate frequency.

FIG. 7 illustrates an alternative embodiment of a clock switch 400 for application in a retimer in which a relatively low frequency local clock is distributed throughout the retimer architecture and multiplied to internal symbol-rate frequency (the "core clock frequency") where needed. In the specific example shown, a 100 MHz local clock and 1 GHz receive clock are supplied to clock switch 400. A frequency divider 401 generates ten frequency-divided and phase-staggered instances of the receive clock—$CK_{RX}/10$ phases—each oscillating at 100 MHz (i.e., $CK_{RX}$ frequency-divided by ten) and each offset from the preceding phase and succeeding phase by the 1 ns $CK_{RX}$ period (i.e., $CK_{RX}/10$ phases staggered by 1 ns and thus evenly distributed within the 10 ns period of a 100 MHz clock). The $CK_{RX}/10$ phases are sampled by the local clock within a boundary-phase locator 403 which, in turn, identifies two temporally-adjacent $CK_{RX}/10$ phases that bound (transition before and after) the local-clock sampling edge. In one embodiment, for instance, boundary-phase locator 403 produces five logical '1' samples and five logical '0' samples, with the neighboring samples that yield logic '1' and logic '0' samples corresponding to the $CK_{RX}/10$ phases that bound the local-clock edge. As shown, boundary-phase locator 403 outputs a select-boundary signal ($sel_{bnd}$) to select the local-clock-edge-bounding $CK_{RX}/10$ phases to be supplied to leading and trailing clock sub-switches 407, 409 via multiplexer/ selector 405 (the phases constituting a leading phase $CK_{RX/10}[i]$ and a trailing phase $CK_{RX/10}[i+1]$, where i+1 overflows to zero when i=9). In one embodiment, each of sub-switches 407 and 409 is implemented generally as shown and described with respect to clock switch 240 of FIG. 3 and operates as described in reference to FIGS. 3-6 to yield a respective frequency-divided output clock ($CK_{out+/10}$ and $CK_{out-/10}$) and alignment-detect signal (AlignDet+ and AlignDet−). In the embodiment shown, the alignment detect signal (e.g., generated by alignment detector unit 270 of FIG. 4) from each of clock sub-switches 407, 409 is supplied to the other, for example, to enable drift-direction determination and also to enable each sub-switch 407, 409 to cease searching (and suppress alignment-detection signal assertion) if the other sub-switch is the first to detect phase alignment. The align-detect signals (one asserted, the other deasserted) are supplied to multiplexer 411 to pass the output clock from the alignment-detecting sub-switch to multiplying PLL 415 and thus produce an output clock at the 1 GHz core-clock frequency (the output clock to become the core clock as discussed above).

Referring to FIGS. 1-7 generally, one or more programmed microcontrollers and/or dedicated hardware circuits (e.g., finite state machines, registered or combinational circuits, etc.) may be provided to implement all or part of the various architectural and functional elements within the SCS retimer embodiments presented herein. Additionally, any or all of those architectural/functional elements (including the entirety of the retimer architecture) may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, the various signaling rates and related frequencies, lane counts, block sizes, encoding/decoding schemes, clock frequencies, frequency-division/multiplication values, numbers of selectable clock phases, and so forth are provided for purposes of example only-higher/lower/alternative rates, frequencies, numbers of phases, frequency divisors/multipliers, lane counts, block sizes, encoding schemes etc. may be implemented in all cases. Similarly, signaling link parameters, protocols, configurations may be implemented in accordance with any practicable open or proprietary standard (PCIe being but one example) and any version of such standard. Links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device or register "programming" can include, for example and without limitation, loading a control value into a configuration register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operational aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit component comprising:

clock recovery circuitry to generate a first clock signal having a first frequency based on transitions in an incoming data signal;

frequency-divider circuitry to generate, by frequency-dividing the first clock signal, a second clock signal having a second frequency N times lower than the first frequency, N being an integer greater than one;

a clock generator to generate a third clock signal having a third frequency that nominally matches the second frequency;

clock selection circuitry to:

generate a fourth clock signal based on the second clock signal during a first time interval and based on the third clock signal during a second time interval; and frequency-multiply the fourth clock signal by N to generate a fifth clock signal having a frequency N times higher than the second frequency during the first time interval and a frequency N times higher than the third frequency during the second time interval; and core circuitry that is clocked by the fifth clock signal throughout the first and second time intervals.

2. The integrated circuit component of claim 1 wherein the clock selection circuitry to generate the fourth clock signal based on the second clock signal during the first time interval and based on the third clock signal during the second time interval comprises a clock selector circuit that (i) transitions from a first state to a second state during a third time interval that transpires between the first and second time intervals and (ii) outputs, as the fourth clock signal, one of the second and third clock signals while in the first state and the other of the second and third clock signals while in the second state.

3. The integrated circuit component of claim 1 wherein the frequency-divider circuitry comprises circuitry to:

generate a set of N clock phases each having a period N*T and being phase-staggered relative to nearest-phase others of the N clock phases by a phase offset N/T, where Tis a period of the first clock signal; and select, as the second clock signal, a first one of the N clock phases that is offset in phase from the third clock signal by less than N/T.

4. The integrated circuit component of claim 3 wherein the circuitry to select the first one of the N clock phases comprises circuitry to:

select, as a leading one of the N clock phases, one of the N clock phases that leads the third clock signal by a first phase offset less than N/T;

select, as a trailing one of the N clock phases, one of the N clock phases that trails the third clock signal by a second phase offset less than N/T; and select, as the first one of the N clock phases, either the leading one of the N clock phases or the trailing one of the N clock phases according to whether the first phase offset is less than or greater than the second phase offset.

5. The integrated circuit component of claim 1 wherein the clock selector circuit comprises circuitry to detect a phase alignment between the second and third clock signals and to transition the clock selector circuit from the first state to the second state in response to detecting the phase alignment.

6. The integrated circuit component of claim 5 wherein the circuitry to detect the phase alignment between the second and third clock signals and transitioning the clock selector circuit from the first state to the second state in response to detecting the phase alignment comprises circuitry to iteratively sample one of the second and third clock signals with the other of the second and third clock signals to determine when successive samples of the one of the second and third clock signals occur before and after a transition of the one of the second and third clock signals.

7. The integrated circuit component of claim 6 wherein the circuitry to iteratively sample one of the second and third clock signals with the other of the second and third clock signals comprises circuitry to:

generate a sequence of phase-delayed instances of the other of the second and third clock signals; and sample the one of the second and third clock signals, at respective times, with the phase-delayed instances of the other of the second and third clock signals.

8. The integrated circuit component of claim 7 wherein the circuitry to generate the sequence of phase-delayed instances of the other of the second and third clock signals comprises:

a delay line to having an input to receive the other of the second and third clock signals and a plurality of daisy-chained delay elements to generate, respectively, a plurality of phase-staggered clock phases corresponding to the other of the second and third clock signals; and circuitry to iteratively select respective ones of the phase-staggered clock phases as the phase-delayed instances of the other of the second and third clock signals.

9. The integrated circuit component of claim 8 wherein the second and third clock signals are mesochronous with respect to one another.

10. The integrated circuit component of claim 5 wherein the second and third clock signals are plesiochronous with respect to one another such that (i) the second and third frequencies differ within a predetermined tolerance and (ii) the circuitry to detect the phase alignment between the second and third clock signals comprises circuitry to determine that the second and third clock signals have drifted into nominal phase alignment at least in part due to their differing frequencies.

11. A method of operation within an integrated circuit component, the method comprising:

generating a first clock signal having a first frequency based on transitions in an incoming data signal;

frequency-dividing the first clock signal to generate a second clock signal having a second frequency N times lower than the first frequency, N being an integer greater than one;

generating a third clock signal having a third frequency that nominally matches the second frequency;

generating a fourth clock signal based on the second clock signal during a first time interval and based on the third clock signal during a second time interval;

frequency-multiplying the fourth clock signal by N to generate a fifth clock signal having a frequency N times higher than the second frequency during the first time interval and a frequency N times higher than the third frequency during the second time interval; and clocking core circuitry within the integrated circuit component with the fifth clock signal throughout the first and second time intervals.

12. The method of claim 11 wherein generating the fourth clock signal based on the second clock signal during the first time interval and based on the third clock signal during the second time interval comprises transitioning a clock selector circuit from a first state to a second state during a third time interval that transpires between the first and second time intervals, the clock selector circuit outputting, as the fourth clock signal, one of the second and third clock signals while in the first state and the other of the second and third clock signals while in the second state.

13. The method of claim 11 wherein frequency-dividing the first clock signal to generate the second clock signal comprises:

generating a set of N clock phases each having a period N*T and being phase-staggered relative to nearest-phase others of the N clock phases by a phase offset N/T, where T is a period of the first clock signal; and selecting, as the second clock signal, a first one of the N clock phases that is offset in phase from the third clock signal by less than N/T.

14. The method of claim 13 wherein selecting the first one of the N clock phases comprises:

selecting, as a leading one of the N clock phases, one of the N clock phases that leads the third clock signal by a first phase offset less than N/T;

selecting, as a trailing one of the N clock phases, one of the N clock phases that trails the third clock signal by a second phase offset less than N/T; and selecting, as the first one of the N clock phases, either the leading one of the N clock phases or the trailing one of the N clock phases according to whether the first phase offset is less than or greater than the second phase offset.

15. The method of claim 13 wherein detecting the phase alignment between the second and third clock signals and transitioning the clock selector circuit from the first state to the second state in response to detecting the phase alignment comprises iteratively sampling one of the second and third clock signals with the other of the second and third clock signals to determine when successive samples of the one of the second and third clock signals occur before and after a transition of the one of the second and third clock signals.

16. The method of claim 15 wherein iteratively sampling one of the second and third clock signals with the other of the second and third clock signals comprises:

generating a sequence of phase-delayed instances of the other of the second and third clock signals; and sampling the one of the second and third clock signals, at respective times, with the phase-delayed instances of the other of the second and third clock signals.

17. The method of claim 16 wherein generating the sequence of phase-delayed instances of the other of the second and third clock signals comprises propagating the other of the second and third clock signals through a delay line to generate a plurality of phase-staggered clock phases corresponding to the other of the second and third clock signals and iteratively selecting respective ones of the phase-staggered clock phases as the phase-delayed instances of the other of the second and third clock signals.

18. The method of claim 11 wherein transitioning the clock selector circuit from the first state to the second state comprises detecting a phase alignment between the second and third clock signals and transitioning the clock selector circuit from the first state to the second state in response to detecting the phase alignment.

19. The method of claim 18 wherein the second and third clock signals are plesiochronous with respect to one another such that (i) the second and third frequencies differ within a predetermined tolerance and (ii) detecting the phase alignment between the second and third clock signals comprises determining that the second and third clock signals have drifted into nominal phase alignment at least in part due to their differing frequencies.

20. An integrated circuit component comprising:

means for generating a first clock signal having a first frequency based on transitions in an incoming data signal;

means for frequency-dividing the first clock signal to generate a second clock signal having a second frequency N times lower than the first frequency, N being an integer greater than one;

means for generating a third clock signal having a third frequency that nominally matches the second frequency;

means for generating a fourth clock signal based on the second clock signal during a first time interval and based on the third clock signal during a second time interval;

means for frequency-multiplying the fourth clock signal by N to generate a fifth clock signal having a frequency N times higher than the second frequency during the first time interval and a frequency N times higher than the third frequency during the second time interval; and means for clocking core circuitry within the integrated circuit component with the fifth clock signal throughout the first and second time intervals.

* * * * *